United States Patent [19]

Shinohara et al.

[11] 4,393,091
[45] Jul. 12, 1983

[54] METHOD OF VACUUM DEPOSITING A LAYER ON A PLASTIC FILM SUBSTRATE

[75] Inventors: Koichi Shinohara, Kobe; Takashi Fujita, Kawanishi, both of Japan

[73] Assignee: Matsushita Electric Industrial Co., Ltd., Kadoma, Japan

[21] Appl. No.: 272,119

[22] Filed: Jun. 10, 1981

[30] Foreign Application Priority Data

Jun. 10, 1980 [JP] Japan .................................. 55-78593
Jun. 10, 1980 [JP] Japan .................................. 55-78609

[51] Int. Cl.³ .......................... B05D 3/00; B05D 3/06
[52] U.S. Cl. .................................... 427/13; 361/234; 427/35; 427/40; 427/251
[58] Field of Search ..................... 427/13, 35, 40, 251; 361/233, 234

[56] References Cited

U.S. PATENT DOCUMENTS 2,221,338 11/1940 Wintermute .......................... 427/40
3,912,826 10/1975 Kennedy ............................. 427/13 X
3,930,066 12/1975 Ryan et al. ......................... 427/35 X
4,291,245 9/1981 Nowlin et al. ..................... 427/35 X

FOREIGN PATENT DOCUMENTS 7138919 11/1971 Japan .................................... 427/13

Primary Examiner—Evan K. Lawrence
Attorney, Agent, or Firm—Wenderoth, Lind & Ponack

[57] ABSTRACT

A method of vacuum depositing a layer on a plastic film in which the film is transported so as to pass along a metal surface moving with the film, which surface removes heat from the film, and vacuum depositing the vapor of an evaporant onto the surface of the plastic film while it is in contact with the metal surface. The film is in an electret state when it is located at the metal surface, whereby an electrostatic attractive force is produced between the film and the metal surface, thereby increasing the efficiency of heat conduction between the film and the metal.

5 Claims, 5 Drawing Figures

METHOD OF VACUUM DEPOSITING A LAYER ON A PLASTIC FILM SUBSTRATE

BACKGROUND OF THE INVENTION

This invention relates to a method of vacuum depositing a layer on a substrate of a plastic film, and more particularly relates to the method suitable for continuously depositing a layer on a film in a continuous manner while the film is transported in a longitudinal direction.

During the deposition process, the temperature of the substrate is raised to a fairly high degree by the radiant heat from an evaporation source, the latent heat due to the deposition of an evaporated substance, etc. Therefore, when the plastic film is used as the substrate for the deposition, it is necessary to control the temperature of the film so as not to exceed a given value, thereby avoiding thermal damage of the film.

In order to control the temperature of the film, there has been employed a method wherein the film is transported along the peripheral surface of a metal cylinder, i.e. a can, and the evaporated substance is controlled so as to be deposited on the opposite portion of the film when it is in contact with the metal surface, so that the heat in the film is dissipated through the metal can by heat conduction.

However, the cooling effect due to the conductivity of the heat through the metal can has not been sufficient to avoid thermal damage of the film in situations where a high melting point metal is deposited into a fairly thick layer, or the deposition rate is high or the thickness of the substrate film is fairly small.

SUMMARY OF THE INVENTION

It is an object of this invention to provide a method of continuously vacuum depositing a layer onto a moving plastic film in which the temperature of the film during deposition is effectively controlled.

According to this invention, the substrate of a plastic film is transported so as to pass along a metal surface movable with the film and deposition is carried out such that the vapor of the source material is deposited onto the plastic film when it is in contact with said metal surface, said film being in an electret state when it is located on said metal surface. According to the procedure, the film is forced to be in intimate contact with the metal surface due to the electrostatic attraction between the film and the metal surface, whereby the efficiency of heat conduction from the film to the metal body is notably increased.

DETAILED DESCRIPTION OF THE INVENTION

Figure 1:
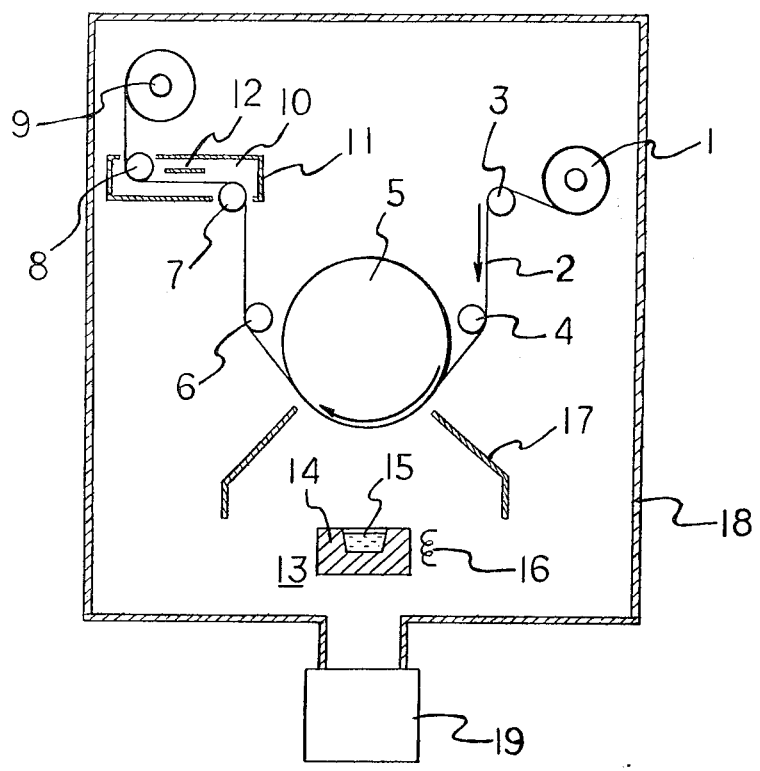
FIG. 1 is an elevational view in section of a deposition apparatus for carrying out a method according to the present invention.

FIG. 1 shows an example of a deposition apparatus for carrying out a method according to the present invention. A numeral 1 denotes a supply roll from which a plastic film 2 is sent out. The film 2 is guided by rollers 3 and 4 to a cylindrical rotary can 5. The metal surface of the can 5 is grounded. After being transported along the peripheral surface of the can 5, the film 2 is guided by rollers 6, 7 and 8 to a take-up reel 9. Between the rollers 7 and 8 the film 2 passes through a glow discharge room 10 which is formed by a partition 11. An electrode 12 for glow discharge is provided in the glow discharge room 10. Between the rollers 7 and 8 and the partition 11 are provided sealing means which are not shown in the Figure.

In a position opposing the film 2 which is in contact with the can 5, there is placed an evaporation source 13 which includes a water-cooled copper hearth 14 and a source material 15, i.e. evaporant charged therein. The source material 15 is heated and evaporated by an electron beam emitted from an electron beam source 16, so as to be deposited on the film 2. A shield plate 17 is provided for limiting the area to which the vapor of the source material 15 is emitted.

The above-mentioned apparatus is contained in a vacuum chamber 18 which is evacuated by an evacuation system 19.

By using the above-mentioned equipment, deposition is carried out as the film 2 is transported, so that a deposition layer is made continuously on the film 12.

A principal feature of the invention is that the film 12 is in an electret state at least when it is located at the surface of the rotary can 5. The electret state of the film causes an electrostatic attractive force to operate between the film 12 and the can 5, which produces an intimate contact between the film 2 and the can 5. Due to this intimate contact, the heat in the film 2 is dissipated into the can 5 by heat conduction at an improved high efficiency. The deposited metal or semiconductor layer supports an intimate contact between the film 2 and the can 5 because it makes for a uniform electrostatic field imparted by the static charge in the film 2.

The substrate film may be rendered into an electret state before the film is loaded in the vacuum chamber or operated in the vacuum chamber by a means provided therein prior to the deposition. In the case where the electron beam is used for heating the source material as shown in FIG. 2, the film can be made into an electret state by supplying electron beams having high energy, such as 20 keV to 60 keV. Such energy is fairly high compared with that supplied in a ordinary deposition process. Thus, electrons reflected by the source material are implanted into the film and so a static charge is stored therein, which makes the film an electro-electret. As a matter of course, other conventional techniques such as thermo-electrets, photo-electrets or mechano-electrets may be employed. The quantity of charge for connecting the film into an electret state or a decay rate may be determined according to the object of deposition.

Means for cooling the film 2 is not limited to the can as mentioned above. A requirement therefor is a structure having a metal surface for contacting the film, said metal surface being movable with the film.

The improvement of cooling efficiency as mentioned above can be similarly obtained even if deposition is carried out by other conventional methods, such as by sputtering, ion plating, etc. Also the desired effects are not influenced by introduction of a gas into the vacuum chamber 18.

According to the present invention, the temperature rise of the substrate film due to deposition is notably decreased, thus making it possible to deposit a fairly thick layer on the plastic film at a high deposition rate.

However, if the film upon which the deposition layer is formed by the method as mentioned above is wound around the take-up reel, the electrostatic charge causes troubles such as a generation of creases, peeling of the deposition layer or tearing of the substrate film on unwinding due to blocking, etc. Those are especially severe in case where the substrate is thin and long and has a smooth surface.

To prevent the aforementioned troubles, charge of electret may be neutralized after the deposition process. An example thereof is shown in FIG. 1 in which the reverse surface of the film 2, i.e., reverse to the deposited layer, is exposed to a glow discharge by the electrode 12. The glow discharge is made in such a manner that a gas of $O_2$, $N_2$, Ar, etc. is introduced into the glow discharge room 10 and an AC voltage is supplied to the electrode 12. Any other conventional glow discharge means may be used. Also it is possible to use other methods of neutralizing the charge such as irradiating the surface of the film opposite to the deposited layer with ions from an ion generator.

The effect obtained by making a substrate film into an electret state according to the invention was examined in cases where the substrate film was made of a polyester, polyimide, polypropylene, polyethylene terephthalate, polyethylene terenaphthalate, polyamide, polycarbonate, polyvinyl chloride, polyvinyl acetate, polyacrylonitrile or a polymethacrylate, and as the source material, i.e., the evaporant, there was employed Al, Si, Ti, Ag, Co, Cr, Ni, V, W, Mo, Fe, NiCr or other alloys. As a result of experiments of making the deposition thicknesses from 0.01 to 0.6$\mu$, it was observed that at the deposition thickness exceeding about 0.15 to 0.2$\mu$, there was produced significant differences between the case of using an electret state substrate and the case of using an ordinary state substrate in respect to the generation of creases and the thermal damage of the substrate.

Figure 2A:
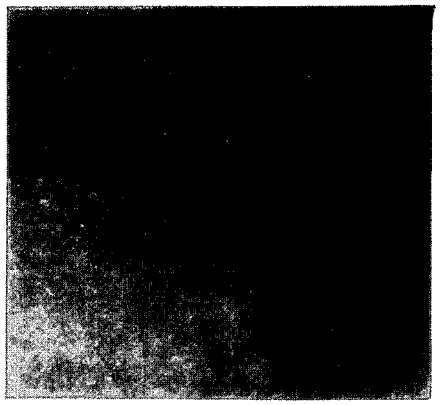
FIGS. 2A and 2B are microscopic photographs of surfaces of deposited layers formed by a method according to the invention and by a conventional technique, respectively.
Figure 2B:
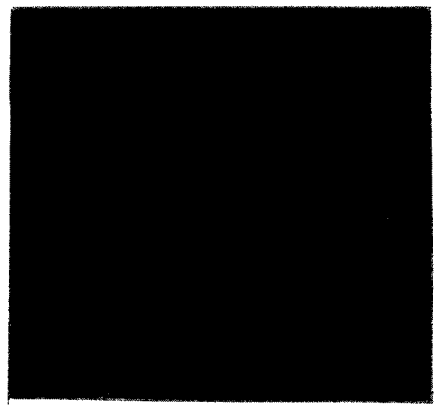

FIGS. 2A and 2B show microscopic photographs of $\times 200$ of layers deposited on the substrate in the electret state and that in ordinary state, respectively. The film of FIG. 2A was obtained by depositing Cr at a thickness of 5000 Å on a polyethylene terephthalate film 4$\mu$ thick which film is in an electret state with a surface potential of 100 V, said film being transported at a speed of 20 m/min. The film of FIG. 2B was obtained by depositing at a thickness of 1500 Å on the non-electret state film, with conditions similar to the case of FIG. 2A. In FIG. 2B, there are observed fairly large amount of cracks, in site of the thickness of the deposited layer being about ⅓ times as large as that in FIG. 2A.

Attempts were made to deposit a 5000 Å layer on a film by using a substrate in an ordinary state, but substrates having a thickness of from 4 to 12$\mu$ were melted partially. In order to obtain a crack free layer as shown in FIG. 2A by using an ordinary state substrate 20$\mu$ thick, the thickness of the deposited layer had to be smaller than 1200 Å. These tendencies were observed irrespectively of the kind of a substrate material and the kind of source material.

Figure 3:
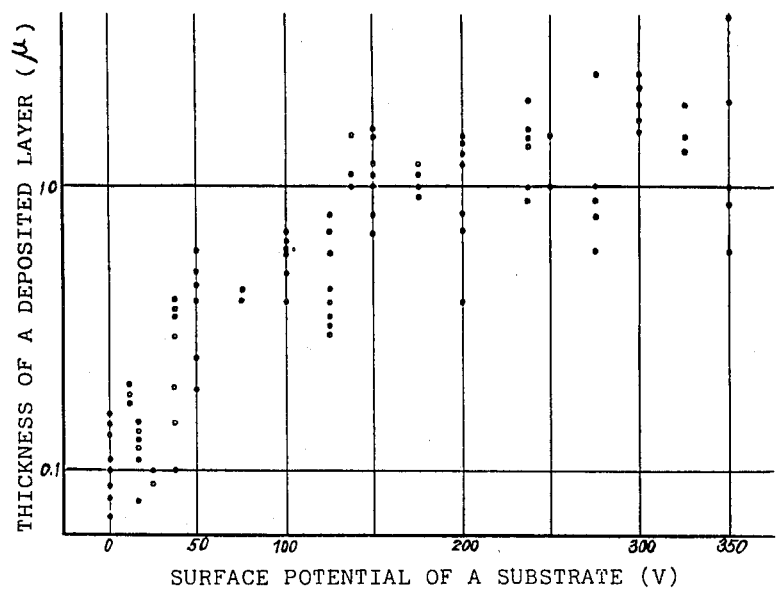
FIG. 3 is a graph showing the relationship between a surface potential of a substrate during deposition and the maximum thickness of a layer deposited in a crack free state.

FIG. 3 shows the relationship between the surface potential of the substrate film and the maximum thickness of the deposited layer obtainable in crack free state. The measurement therefor is operated by using a polyethylene terenaphthalate film 4$\mu$ thick as a substrate and depositing Ti. In FIG. 3 the surface potentials from 0 V to 20 V are due to a triboelectricity and those from 50 V to 350 V are caused by the electret state according to the present invention. The maximum thickness saturates at above a surface potential about 150 V. Such tendency is similar irrespectively of a kind of a substrate material, the thickness of a substrate, the nature of the source material and the deposition conditions. A threshold value for obtaining the effect of the invention, i.e. a value corresponding to 50 V in FIG. 3, varies according to those conditions. The above-mentioned saturation potential, 150 V, is obtained if the surface roughness of the metal surface for cooling is smaller than 0.1$\mu$. The upper limit of the surface potential practically usable is about 600 V.

Hereinafter specified examples of the effect of exposing a substrate film to a glow discharge after deposition and before winding will be described.

Figure 4:
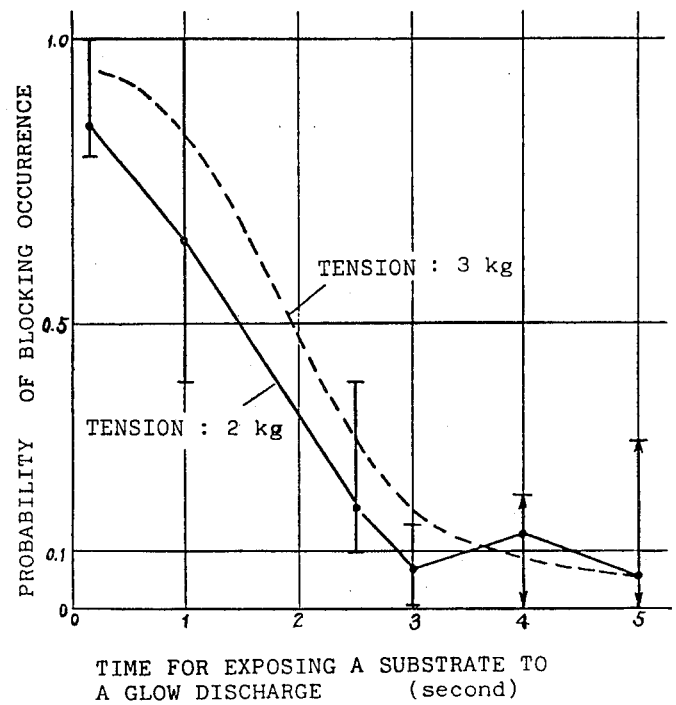
FIG. 4 is a graph showing the relationship between the time for exposing a substrate to a glow discharge after deposition and the probability of a blocking occurrence.

FIG. 4 shows the relationship between the time for exposing the film to the glow discharge and the probability of tearing occurring in the substrate film due to blocking during unwinding. The probability is expressed by noting as 1 the case where a blocking occurs once a cycle of winding and unwinding a 500 m length film. The deposition measurements were performed under conditions such that a 3.5$\mu$ thick polycarbonate film was used as the substrate, the source material was Ti and the surface potential of the substrate was 200 V before the exposure to a glow discharge. It is seen from FIG. 4 that the effect of the exposure to a glow discharge according to the invention is notable.

Further the difference in the occurrence of blocking between cases with the glow discharge treatment and cases without it was investigated under the following various conditions for depositing a layer.

Experiment 1
  Substrate: polyester; 5 to 12$\mu$ thick
  Deposited Layer: Co; 500 Å thick
  Heating of evaporant: Electron Beam; 16 kW
  Film Transporting Speed: 25 m/min
  Vacuum: $6 \times 10^{-5}$ Torr Experiment 2
  Substrate: polyimide; 25$\mu$ thick
  Deposited Layer: Ti; 400 Å thick
  Heating of evaporant: Electron Beam; 16 kW
  Film Transporting Speed: 16 m/min
  Vacuum: $1.5 \times 10^{-5}$ Torr Experiment 3
  Substrate: polypropylene; 4 to 10$\mu$ thick
  Deposited Layer: Al; 500 to 1000 Å thick
  Heating of evaporant: Induction Heat; 6 kW
  Film Transporting Speed: 60 m/min
  Vacuum: $8 \times 10^{-5}$ Torr Experiment 4
  Substrate: polyester; 5 to 12$\mu$ thick
  Deposited Layer: NiCr; 600 Å thick
  Depositing Method: Sputtering in Ar gas; $10^{-2}$ Torr; 1 kW
  Film Transporting Speed: 16 m/min Conditions of glow discharge were as follows:
    Pressure Range: $10^{-1}$ to $10^{-4}$ Torr Frequency: 0 to 44 MHz Voltage: 10 $V_{p-p}$ to 3 $kV_{p-p}$ Current Density: 1 to 600 μA per unit area of an electrode Introduced Gas: residual gas only, $O_2$, Ar, $N_2$, $CO_2$ As a result of the above-mentioned experiments, it was found that if the mean surface roughness of the substrate was smaller than about 0.1μ, blocking occurred in the oil cases without a glow discharge treatment, though blocking did not occur in the cases with it. In the case in which the glow discharge treatment was effected, blocking did not occur even if the surface roughness of the substrate was 0.01μ.

As for the conditions of glow discharge, there is not observed any significant differences due to differences in the glow discharge conditions except that the current density supplied should be controlled according to the transporting speed of the substrate film.

What is claimed is:

1. A method of vacuum depositing a layer on a plastic film prior to winding the film comprising the steps of:
   transporting the film along a metal surface which is movable with the film, said metal surface being grounded and which metal serves to control the temperature of the film in contact therewith by conducting heat away from said film;
   rendering said film in an electret state with a surface potential higher than 150 V, prior to or at the same time as the film contacts the metal surface, whereby said film is electrostatically attracted to said metal surface, thereby increasing the efficiency of the heat conduction between the film and the metal surface;
   depositing a material on the portion of said film which is opposite the portion in contact with said metal surface; and
   neutralizing the surface potential of said film so as to render it into a non-electret state after said deposition step and prior to winding the film.

2. A method as claimed in claim 1, in which said source material is heated and evaporated by an electron beam bombardment, the energy of said electron being high enough to cause an electron reflected from said source material to be implanted into the film to form a static charge to render the film into an electret state.

3. A method as claimed in claim 1, in which said metal surface comprises the peripheral surface of a rotary can.

4. A method as claimed in claim 1, in which said neutralizing is performed by exposing the surface of the film reverse to the deposited layer to a glow discharge.

5. A method as claimed in claim 1, in which the surface roughness of said metal surface is smaller than 0.1μ.

* * * * *